(12) United States Patent
Archibald et al.

(10) Patent No.: US 8,351,192 B2
(45) Date of Patent: Jan. 8, 2013

(54) CABLE-FREE POWER DISTRIBUTION IN A RACK

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/853,974

(22) Filed: Aug. 10, 2010

(65) Prior Publication Data

US 2012/0039032 A1  Feb. 16, 2012

(51) Int. Cl.
*G06F 1/16* (2006.01)
(52) U.S. Cl. ............ 361/679.02; 248/201; 312/270.3; 307/147; 439/271
(58) Field of Classification Search ............. 307/11, 307/39, 147; 439/210, 540.1, 752, 653, 135, 439/381, 271; 398/66; 361/695, 778, 679.33, 361/679.39, 679.46, 679.37, 679.01, 679.35, 361/679.21, 679.27, 679.09, 679.4, 679.36, 361/679.55; 248/672, 316.7, 310, 636, 634, 248/615, 201; 312/223.3, 332.1, 244, 270.3, 312/333

See application file for complete search history.

(56) References Cited

U.S. PATENT DOCUMENTS

| 6,967,283 | B2 | 11/2005 | Rasmussen et al. |
| 7,138,733 | B2* | 11/2006 | Sanders et al. ............. 307/147 |
| 7,173,821 | B2* | 2/2007 | Coglitore .................. 361/695 |
| 7,252,524 | B1 | 8/2007 | Johnson, Jr. et al. |
| 7,672,590 | B2 | 3/2010 | Niedrich et al. |
| 8,023,262 | B2* | 9/2011 | Ligtenberg et al. ...... 361/679.55 |
| 2005/0068754 | A1 | 3/2005 | Corrado et al. |
| 2008/0197702 | A1 | 8/2008 | Banach |
| 2009/0236909 | A1 | 9/2009 | Aldag et al. |

FOREIGN PATENT DOCUMENTS

JP  2007128498 A  5/2007

* cited by examiner

*Primary Examiner* — Hung Duong
(74) *Attorney, Agent, or Firm* — H. Barrett Spraggins; Cynthia G. Seal; Biggers & Ohanian, LLP.

(57) ABSTRACT

A rack for housing electrically powered components, the rack including: a power distribution bus configured to distribute AC power among components installed in the rack via direct coupling without cables; a plurality of slots, each slot configured to receive a component; and one or more components, each component installed in one of the plurality of slots, each component directly coupled to the power distribution bus without a cable, at least one of the components comprising an inter-rack power distribution unit ('PDU') configured to provide AC power to other components installed in the rack via the power distribution bus.

15 Claims, 5 Drawing Sheets

CABLE-FREE POWER DISTRIBUTION IN A RACK

BACKGROUND OF THE INVENTION

1. Field of the Invention

The field of the invention is power distribution, or, more specifically, methods of cable-free power distribution in a rack configured to house electrically powered components, racks for housing electrically powered components and cable-free power distribution, and components configured for installation in a rack configured for cable-free power distribution.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Today, computer systems (such as servers or blade servers) may be housed in a rack with other components: routers, switches, hard disk arrays, optical disk drives, and the like. Some or all of the components, including the computer systems, may require a connection to AC power (Alternating Current) to operate. Such a connection in typical rack systems today requires a cable that couples a computer system to a power supply, such as a power distribution unit. A rack that houses many computer systems and other components will, thus, include a correspondingly great number of power cables to couple each of the housed computer systems to power. The greater the number of cables included in a rack system, the greater the cost and the complexity of the rack system.

SUMMARY OF THE INVENTION

Racks for housing electrically powered components and distributing power in a cable-free manner are disclosed. Such a rack includes a power distribution bus configured to distribute Alternating Current ('AC') power among components installed in the rack via direct coupling without cables; a plurality of slots, with each slot configured to receive a component; and one or more components, each component installed in one of the plurality of slots, each component directly coupled to the power distribution bus without a cable, at least one of the components being an inter-rack power distribution unit ('PDU') configured to provide AC power to other components installed in the rack via the power distribution bus.

Methods of cable-free power distribution in a rack configured to house electrically powered components are also disclosed. Such methods include receiving, in each of a plurality of slots of the rack, one of a plurality of components, at least one of the plurality of component including an inter-rack power distribution unit ('PDU'); directly coupling a power distribution bus of the rack to each component without a cable upon receipt of the component in a slot of the server rack; receiving, by the power distribution bus, Alternating Current ('AC') power from the inter-rack PDU; and distributing, by the power distribution bus, the AC power received from the inter-rack PDU to other components in the rack.

Components configured for installation in a rack that provides cable-free power distribution are also disclosed. Such components include a coupling member configured to directly couple, without a cable, to a power distribution bus of a rack upon installation of the component in the rack, where the power distribution bus is configured to receive Alternating Current ('AC') power from an inter-rack power distribution unit ('PDU') and distribute the AC power to components installed in the rack.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
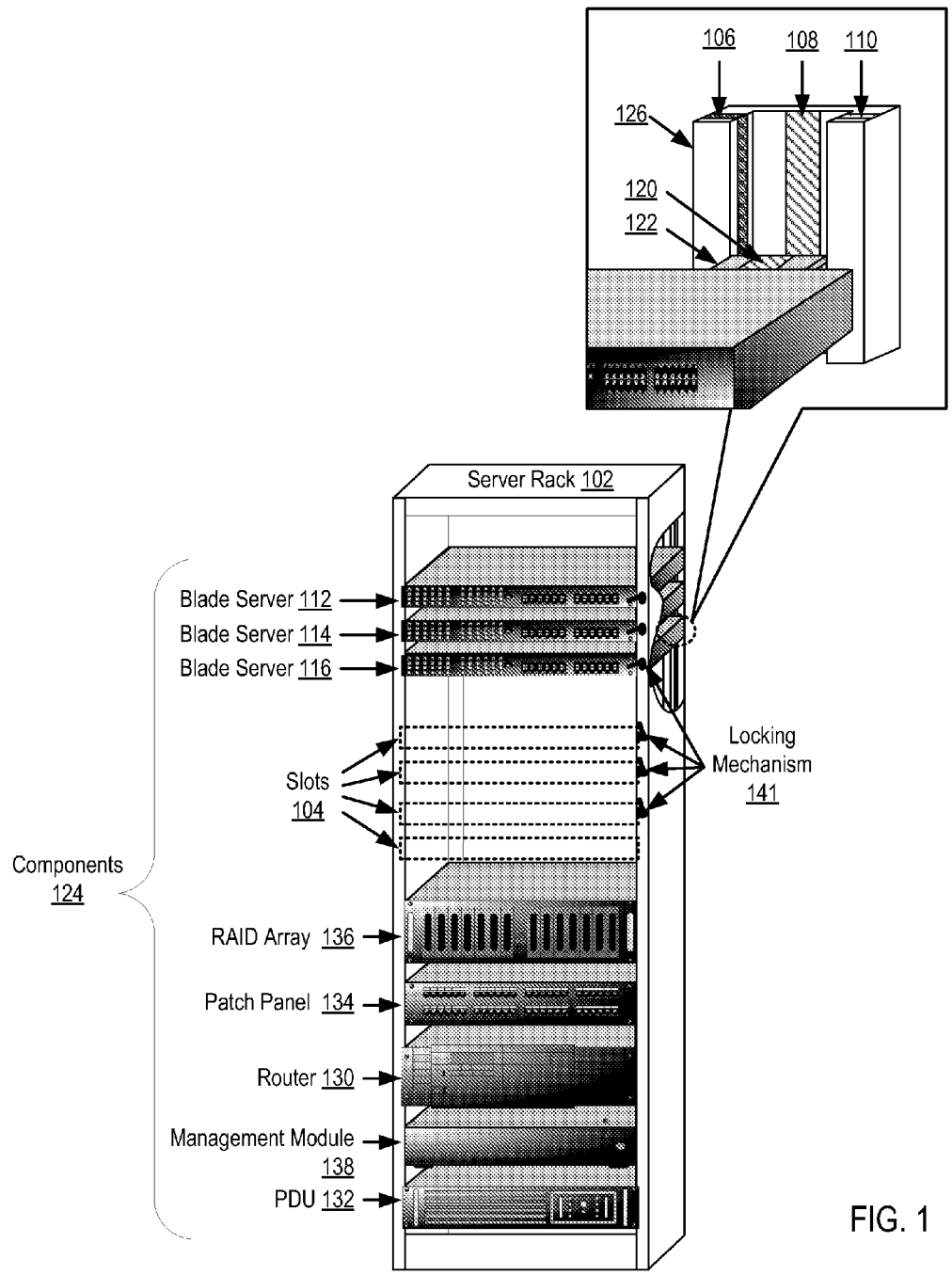
FIG. 1 sets forth a line drawing of an exemplary rack configured to house electrically powered components and configured for cable-free power distribution according to embodiments of the present invention.

Exemplary methods of cable-free power distribution in a rack configured to house electrically powered components, racks for housing electrically powered components and configured for cable-free power distribution, and components configured for installation in a rack configured for cable-free power distribution in accordance with embodiments of the present invention are described with reference to the accompanying drawings, beginning with FIG. 1. FIG. 1 sets forth a line drawing of an exemplary rack configured to house electrically powered components and configured for cable-free power distribution according to embodiments of the present invention.

The system of FIG. 1 includes a server rack (102), a type of rack for housing electrically powered components. An electrically powered component as the term is used in this specification refers to any device capable of being installed in a server rack that utilizes electrical power. Examples of electrically powered components installed in slots of the server rack (102) of FIG. 1 include blade severs (112, 114, and 116), a Redundant Array of Inexpensive, or Independent, Drives ('RAID array') (136), a router (130), a management module (138), and a power distribution unit ('PDU') (132).

A rack is a frame or enclosure for mounting multiple equipment modules, also called components. Each components is installed in a slot (104) of the rack, a receptacle in the rack configured for receiving components. Such slots may include rails or the like to aid and support the installation of components. A server rack (102) is a rack specifically designed to house servers—a type of component. Such a server rack may implement, in a mid-plane, back-plane, or other part of the server rack, services for components installed in the rack, such as power, cooling, networking, various interconnects, management services, and the like.

A server, as the term is used in this specification, refers generally to a multi-user computer that provides a service (e.g. database access, file transfer, remote access) or resources (e.g. file space) over a network connection. The term 'server,' as context requires, refers inclusively to the server's computer hardware as well as any server application software or operating system software running on the server. A server application is an application program that accepts connections in order to service requests from users by sending back responses. A server application can run on the same computer as the client application using it, or a server application can accept connections through a computer network. Examples of server applications include file server, database server, backup server, print server, mail server, web server, FTP servers, application servers, VPN servers, DHCP servers, DNS servers, WINS servers, logon servers, security servers, domain controllers, backup domain controllers, proxy servers, firewalls, and so on.

Blade servers are self-contained servers, designed for high density. A blade enclosure, similar to the server rack (102) of FIG. 1, provides services such as power, cooling, networking, various interconnects and management—though different blade providers have differing principles around what should and should not be included in the blade itself—and sometimes in the enclosure altogether. Together, a set of blade servers installed in a blade enclosure, or 'blade center,' form a blade system. As a practical matter, all computers are implemented with electrical components requiring power that produces heat. Components such as processors, memory, hard drives, power supplies, storage and network connections, keyboards, video components, a mouse, and so on, merely support the basic computing function, yet they all add bulk, heat, complexity, and moving parts that are more prone to failure than solid-state components. In the blade paradigm, most of these functions are removed from the blade computer, being either provided by the blade enclosure (DC power) virtualized (iSCSI storage, remote console over IP), or discarded entirely (serial ports). The blade itself becomes simpler, smaller, and amenable to dense installation with many blade servers in a single blade enclosure.

The example server rack (102) of FIG. 1 also includes a power distribution bus (126) configured to distribute Alternating Current ('AC') power among components (124) installed in the rack (102) via direct coupling without cables. In the example of figure the power distribution bus comprises three separate and distinct conductive strips (106, 108, 110), with each strip conducting a leg, or phase, of an AC power supply. The power distribution bus (126) in the example of FIG. 1, for example, may include an L1 strip (106), an L2 or Neutral strip (108), and a ground strip (110).

The inter-rack PDU (132) is configured to provide AC power (received from a source not shown) to the other components (124) installed in the server rack (124) via the power distribution bus. A PDU is a device that distributes electric power. Some large industrial units are used for reducing high voltage and current to more common and useful levels, such as, reducing 240V 30 A single phase to multiple 120V 15 A or 120V 20 A. PDUs of the prior art which may be modified for cable-free power distribution in accordance with embodiments of the present invention can be dumb—meaning that they have no instrumentation and are not manageable, or they can be metered—meaning that they are equipped with a display that shows current load on each phase, or they can be switched—meaning that some or all of their receptacles can be individually switched on or off remotely. A 240 volt circuit (120 volts ×2 plus neutral and ground) may have two legs at 120 volts. A distro may be utilized to switch and provide circuit protection for taps off of the multiple phases or legs. A PDU may provide a solidly bonded neutral leg and a safe grounding system. PDUs may be implemented in one of two types, each type distinguished by the type of input power: single-phase and three-phase. The output power of the PDU is typically single-phase.

In the example server rack (102) of FIG. 1, each component (124) installed in the server rack (102) is directly coupled to the power distribution bus (126) without a cable. Each component (124) includes a power connector (122). Each power connector may include one or more conductive strips (120) configured such that when component is installed in the server rack, the conductive strip (120) of the component (124) contacts a conductive strip (106, 108, 110) of the power distribution bus (126). Also in the example of FIG. 1, the power distribution bus (126) is implemented as a channel, a female receptacle, adapted to receive the power connector of each component. As such, each component (124) is directly coupled to the power distribution bus (126) upon installation of the component in the rack and upon insertion of the power connector (122) of the component (124) into the power distribution bus (126) channel.

The example server rack (102) of FIG. 1 also includes one or more locking mechanisms (141). Each of the locking mechanisms is configured to prevent unintentional removal of a component (124) from a slot (104) in the rack (102). Because of the direct coupling between a component's power connector (122) and the power distribution bus (126), removal of a component from a slot, even if unintentional, may decouple the components power connector (122) from the power distribution bus (126). As such, the rack (102) may be configured with various types of locking mechanisms to insure that removal of components is intentional, rather than accidental.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2A:
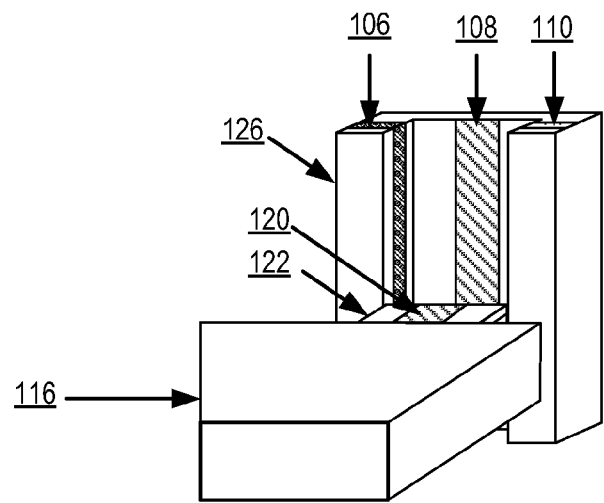
FIG. 2A sets forth a line drawing of an exemplary power distribution bus of a server rack configured for cable-free power distribution in accordance with embodiments of the present invention and a component configured in accordance with embodiments of the present invention for installation in such a server rack.
Figure 2B:
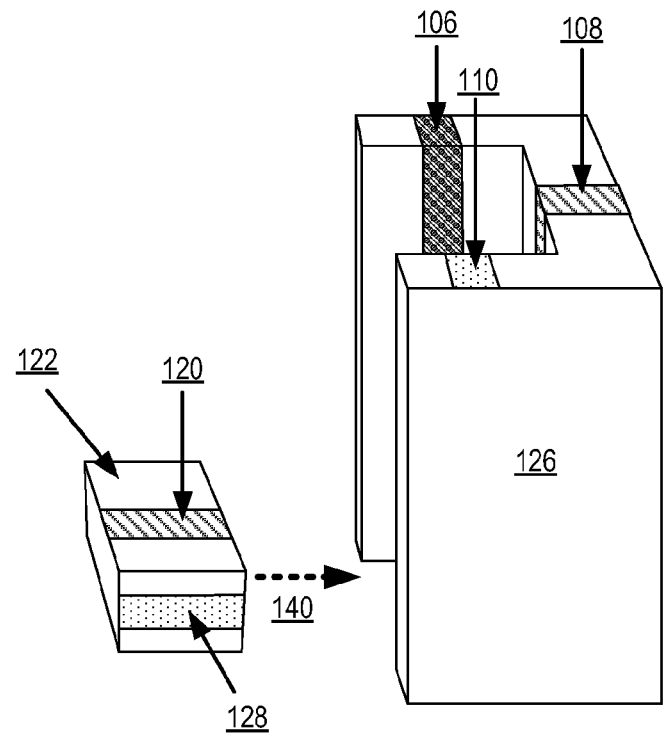
FIG. 2B sets forth a line drawing of a further exemplary power distribution bus of a server rack configured for cable-free power distribution in accordance with embodiments of the present invention and a component configured in accordance with embodiments of the present invention for installation in such a server rack.

For further explanation, FIGS. 2A and 2B each set forth a line drawing of an exemplary power distribution bus of a server rack configured for cable-free power distribution in accordance with embodiments of the present invention and a component configured in accordance with embodiments of the present invention for installation in such a server rack. The example power distribution bus (126) of FIGS. 2A and 2B is configured to distribute Alternating Current ('AC') power among components, such as the server (116) installed in a rack, such as the example server rack (102) of FIG. 1, via direct coupling without cables.

The component in the example of FIGS. 2A and 2B, the server (116), includes a coupling member, in this case, a power connector (122). A power connector (122) as the term is used here refers to a male connector, an extrusion, contrasted with a female receptacle. The power distribution bus (126) in the example of FIGS. 2A and 2B is configured to mate or engage with the power connector (122) of the server (116). The power distribution bus (126) in these examples is a channel, a female receptacle, adapted to receive the power connector (122) of the server.

The server (116) is directly coupled to the power distribution bus upon installation of the component in the rack and upon insertion of the power connector (122) of the component into the power distribution bus channel. The power connector (122) and power distribution bus (126) is said to be coupled in that upon 'coupling' electrical current can flow between strips (106, 108, 110) of the power distribution bus (126) and strips (120, 128, and another not shown) of the power connector. FIG. 2B includes an arrow (140), showing the direction in which the power connector (122) is inserted into the power distribution bus (126) channel.

Figure 3A:
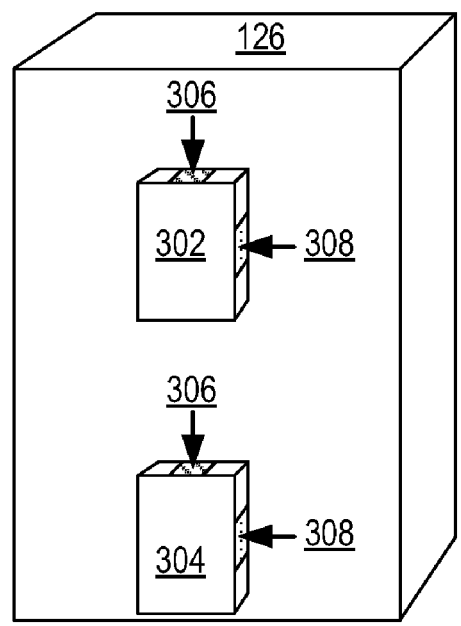
FIG. 3A sets forth a line drawing of a further exemplary power distribution bus of a server rack configured for cable-free power distribution in accordance with embodiments of the present invention.

For further explanation, FIG. 3A sets forth a line drawing of a further exemplary power distribution bus of a server rack configured for cable-free power distribution in accordance with embodiments of the present invention. The example power distribution bus (126) of FIG. 3A is similar to that of FIGS. 2A and 2B in that the power distribution bus (126) of FIG. 3A is configured to distribute AC power among components installed in a rack via direct coupling without cables.

The power distribution bus (126) in the example of FIG. 3A differs from the power distribution bus of FIGS. 2A and 2B, however, in that the power distribution bus (126) in the example of FIG. 3A includes a plurality of power connectors (302, 304) with each power connector (302, 304) adapted for insertion into a power connector receptacle of a component. That is, instead of a female receptacle—a channel—the power distribution bus (126) in the example of FIG. 3A includes extrusions, male power connectors.

Each of the power connectors (302, 304) includes one or more conductive strips (306, 308, and another not shown) configured to carry electrical current from a PDU to a conductive component installed in the rack. The power connectors (302) may be spaced such that there is one power connector for every slot of the rack. In a 19 inch rack, for example, power connectors (302, 304) may be spaced on the power distribution bus (126) every 19 inches.

Figure 3B:
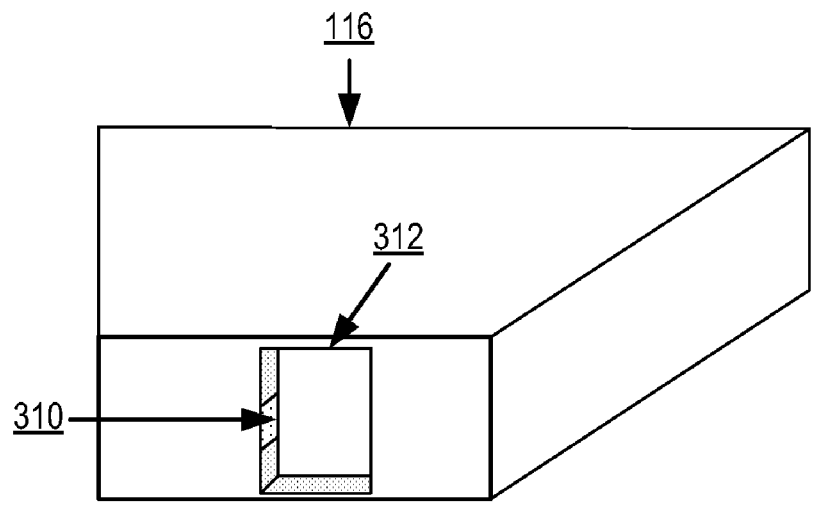
FIG. 3B sets forth a line drawing of a further exemplary component configured for installation in a rack capable of cable-free power distribution in accordance with embodiments of the present invention.

For further explanation, FIG. 3B sets forth a line drawing of a further exemplary component configured for installation in a rack capable of cable-free power distribution in accordance with embodiments of the present invention and, more specifically, for installation in a rack configured with a power distribution bus similar to that depicted in the example of FIG. 3A. The server (116), an example component, in FIG. 3B includes a coupling member, in this case, a power connector receptacle (312)—a female receptacle. The power connector receptacle (312) is configured to directly couple, without a cable, to a power distribution bus (126 in FIG. 3A) of a rack upon installation of the server in the rack. The power distribution bus is configured to receive AC power from an inter-rack PDU and distribute the AC power to the component (116) installed in the rack. The power connector receptacle (312) of the server (116) in the example of FIG. 3B includes one or more conductive strips (310), with each strip configured to connect to a conductive strip of a power connector of the power distribution bus, upon insertion of the power connector in the power connector receptacle (312). The insertion of the power distribution bus's power connector is carried when the server (116) is installed in the rack.

Figure 4A:
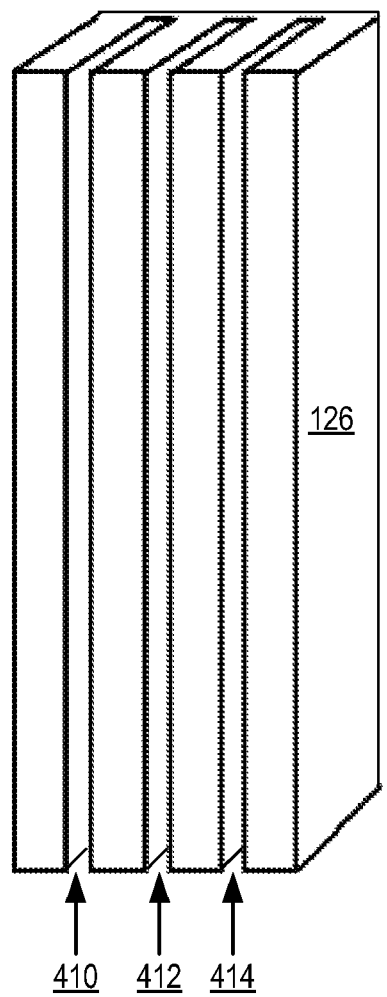
FIG. 4A sets forth a line drawing of a further exemplary power distribution bus of a rack configured for cable-free power distribution in accordance with embodiments of the present invention.

For further explanation, FIG. 4A sets forth a line drawing of a further exemplary power distribution bus of a server rack configured for cable-free power distribution in accordance with embodiments of the present invention. The power distribution bus (126) in the example of FIG. 4A differs from the power distribution bus of FIGS. 2A and 2B, however, in that the power distribution bus (126) in the example of FIG. 4A includes a plurality of channels (410, 412, 414) rather than a single channel. Each of the channels in the example power distribution bus (126) of FIG. 4A may be configured with one or more conductive strips (not shown here) configured to carry electrical current from a PDU to a conductive component installed in the rack. The conductive strip in channel (410) may carry current on the L1 leg of AC power, the conductive strip in channel (412) may carry current on the L2 leg of AC power, and the conductive strip in channel (414) may be configured as a ground or neutral leg. Each of the channels (410, 412, 414) is configured to receive an male power connector of a coupling member of an electrically powered component, when the component is installed in the rack.

Figure 4B:
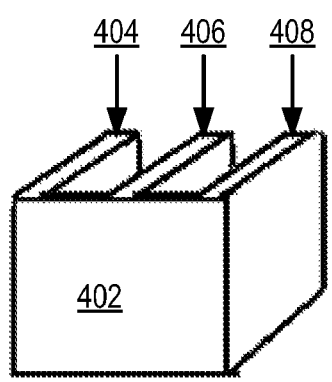
FIG. 4B sets forth a line drawing of an exemplary coupling member of an electrically powered component configured for installation in a rack capable of cable-free power distribution in accordance with embodiments of the present invention FIG. 5 sets forth a flow chart illustrating an exemplary method for cable-free power distribution in a rack configured to house electrically powered components.

For further explanation, therefore FIG. 4B sets forth a line drawing of an exemplary coupling member of an electrically powered component configured for installation in a rack capable of cable-free power distribution in accordance with embodiments of the present invention and, more specifically, for installation in a rack configured with a power distribution bus similar to that depicted in the example of FIG. 4A. The coupling member (402) in the example of FIG. 4B includes three male power connectors (404, 406, 408)—extrusions. Each of the power connectors is configured for insertion into a channel of a power distribution bus similar to the bus (126) of FIG. 4A. Each of the power connectors includes a conductive strip that is capable of electrically coupling to the conductive strips of the channels of the power distribution bus (126) upon insertion of the power connector into the channel. Consider, for example, that power connector (404) includes a conductive strip configured to couple to an L1 leg of AC power, power connector (406) includes a conductive strip configured to couple to L2 leg of AC power, and power connector (408) includes a conductive strip configured to couple to a ground or neutral. Upon insertion of an electrically powered component that includes the coupling member (402) of FIG. 4B into a rack that includes the power distribution bus (126) of FIG. 4A, the power connectors (404, 406, 408) will mate with the channels (410, 412, 414) and the conductive strips of the power connectors and channels will be electrically coupled.

Figure 5:
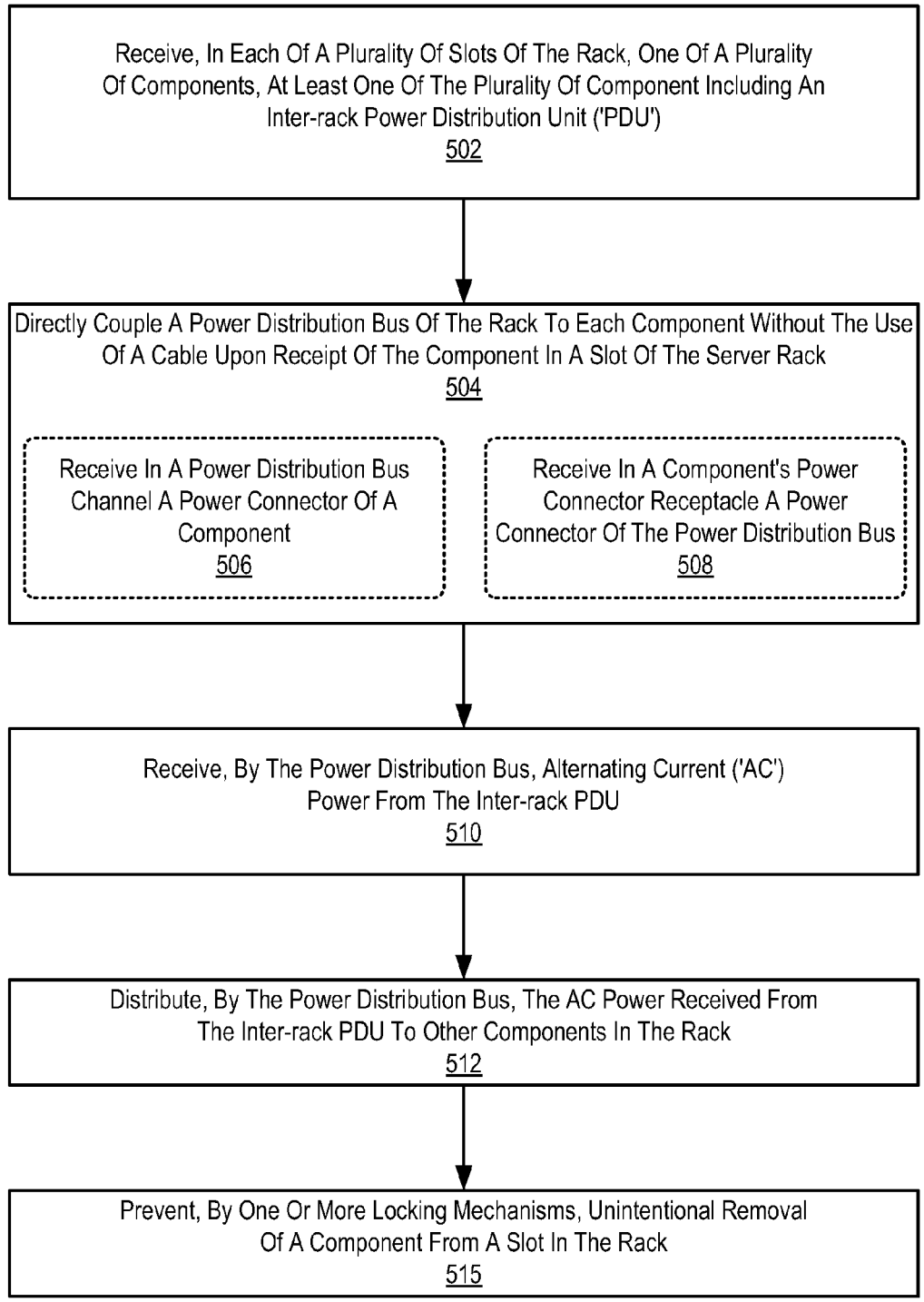

For further explanation, FIG. 5 sets forth a flow chart illustrating an exemplary method for cable-free power distribution in a rack configured to house electrically powered components. The method of FIG. 5 includes receiving (502), in each of a plurality of slots of the rack, one of a plurality of components. In the method of FIG. 5, at least one of the plurality of component comprising an inter-rack power distribution unit ('PDU'). Receiving (502) one of the components in a slot may be carried out by receiving the component on rails, in a channel, and so on as will occur to readers of skill in the art.

The method of FIG. 5 also includes directly coupling (504) a power distribution bus of the rack to each component without a cable upon receipt of the component in a slot of the server rack. Directly coupling (504) the power distribution bus to each component without a cable may be carried out in various ways depending upon the implementation of the components and the power distribution bus. In some implementations, for example, each component includes a power connector—a connector that extrudes from the component's chassis—and the power distribution bus is formed by a channel—a female receptacle—where the channel is adapted to receive the power connector of each component. In such an implementation, directly coupling (504) the power distribution bus to each component may be carried out by receiving (506) in the power distribution bus channel the power connector of the component. In other implementations, each component includes a power connector receptacle—a female receptacle—and the power distribution bus includes a plurality of power connectors—a connector extruding from the bus itself—where each power connector is adapted for insertion into a power connector receptacle. In such an implementation, directly coupling (504) the power distribution bus to each component may be carried out by receiving (508) in the component's power connector receptacle a power connector of the power distribution bus.

The method of FIG. 5 also includes receiving (510), by the power distribution bus, Alternating Current ('AC') power from the inter-rack PDU. The power distribution bus may receive AC power from the inter-rack PDU through one or more conductive strips of the power distribution bus upon connection with one or more conductive strips of coupling member (power connector or power connector receptacle, for example) of the inter-rack PDU.

The method of FIG. 5 also includes distributing (512), by the power distribution bus, the AC power received from the inter-rack PDU to other components in the rack. The power distribution bus may distribute (512) the AC power via one or more conductive strips of the power distribution bus, through one or more conductive strips of a coupling member (power connector or power connector receptacle) of each installed component.

The method of FIG. 5 also includes preventing (514), by one or more locking mechanisms, unintentional removal of a component from a slot in the rack. Preventing (514) unintentional removal of a component from a slot in the rack may be carried out by physically blocking removal a component from a slot in the rack. That is, a locking mechanism, when engaged, may be positioned in such a way that the body of the locking mechanism impedes removal of a component until manually unengaged.

Methods of cable-free power distribution carried out in accordance with embodiments of the present invention provide many benefits. Such benefits include, for example, a reduction in the cost and complexity of cabling for each rack capable of cable-free power distribution due to the reduction in the number of cables—namely none—utilized to distributed power within a rack from a PDU to multiple components installed in the rack without the use of a cables.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A rack for housing electrically powered components, the rack comprising:
    a power distribution bus configured to distribute Alternating Current ('AC') power among components installed in the rack via direct coupling without cables;
    a plurality of slots, each slot configured to receive a component; and
    one or more components, each component installed in one of the plurality of slots, each component directly coupled to the power distribution bus without a cable, at least one of the components comprising an inter-rack power distribution unit ('PDU') configured to provide AC power to other components installed in the rack via the power distribution bus.

2. The rack of claim 1 wherein:
    each component comprises a power connector;
    the power distribution bus comprises a channel adapted to receive the power connector of each component; and
    each component is directly coupled to the power distribution bus upon installation of the component in the rack and insertion of the power connector of the component into the power distribution bus channel.

3. The rack of claim 1 wherein:
    each component comprises a power connector receptacle;
    the power distribution bus comprises a plurality of power connectors, each power connector adapted for insertion into a power connector receptacle; and
    each component is directly coupled to the power distribution bus upon installation of the component in the rack and insertion of a power distribution bus power connector into the power connector receptacle of the component.

4. The rack of claim 1 further comprising one or more locking mechanisms configured to prevent unintentional removal of a component from a slot in the rack.

5. The rack of claim 1, wherein the rack comprises a blade server enclosure and at least one of the components comprises a blade server.

6. A method of cable-free power distribution in a rack configured to house electrically powered components, the method comprising:
    receiving, in each of a plurality of slots of the rack, one of a plurality of components, at least one of the plurality of components comprising an inter-rack power distribution unit ('PDU');
    directly coupling a power distribution bus of the rack to each component without a cable upon receipt of the component in a slot of the server rack;
    receiving, by the power distribution bus, Alternating Current ('AC') power from the inter-rack PDU; and
    distributing, by the power distribution bus, the AC power received from the inter-rack PDU to other components in the rack.

7. The method of claim 6 wherein:
    each component comprises a power connector;
    the power distribution bus comprises a channel adapted to receive the power connector of each component; and directly coupling the power distribution bus to each component further comprises receiving in the power distribution bus channel the power connector of the component.

8. The method of claim 6 wherein:

each component comprises a power connector receptacle;

the power distribution bus comprises a plurality of power connectors, each power connector adapted for insertion into a power connector receptacle; and directly coupling the power distribution bus to each component further comprises receiving in the component's power connector receptacle a power connector of the power distribution bus.

9. The method of claim 6 further comprising preventing, by one or more locking mechanisms, unintentional removal of a component from a slot in the rack.

10. The method of claim 6 wherein the rack comprises a blade server enclosure and at least one of the components comprises a blade server.

11. A component configured for installation in a rack, the component comprising:

a coupling member, the coupling member configured to directly couple, without a cable, to a power distribution bus of a rack upon installation of the component in the rack, wherein the power distribution bus is configured to receive Alternating Current ('AC') power from an inter-rack power distribution unit ('PDU') and distribute the AC power to components installed in the rack.

12. The component of claim 11, wherein the component comprises a blade server.

13. The component of claim 11, wherein the component comprises the inter-rack PDU.

14. The component of claim 11, wherein:

the coupling member comprises power connector;

the power distribution bus comprises a channel; and the coupling member directly couples to the power distribution bus upon insertion of the power connector in the channel of the power distribution bus.

15. The component of claim 11, wherein:

the coupling member comprises power connector receptacle;

the power distribution bus comprises a plurality of power connectors; and the coupling member directly couples to the power distribution bus upon insertion of a power connector of the power distribution bus in the power connector receptacle of the component.

* * * * *